(12) United States Patent
Van Den Berg

(10) Patent No.: US 6,313,627 B1
(45) Date of Patent: Nov. 6, 2001

(54) SENSOR DEVICE FOR DETECTING THE DIRECTION OF AN EXTERNAL MAGNETIC FIELD USING A MAGNETORESISTIVE SENSOR ELEMENT

(75) Inventor: Hugo Van Den Berg, Herzogenaurach (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/161,204

(22) Filed: Sep. 24, 1998

(30) Foreign Application Priority Data

Sep. 24, 1997 (DE) .............................. 197 42 134

(51) Int. Cl.⁷ ..................... G01R 33/09; H01L 43/08
(52) U.S. Cl. ........................ 324/252; 338/32 R
(58) Field of Search ................. 324/207.21, 252; 338/32 R; 360/314, 315, 316

(56) References Cited

U.S. PATENT DOCUMENTS

| 4,401,944 | * | 8/1983 | Narimatsu et al. | 324/207.21 |
| 5,561,368 | * | 10/1996 | Dovek et al. | 324/252 |
| 5,686,837 | * | 11/1997 | Coehoorn et al. | 324/252 |
| 5,945,825 | * | 8/1999 | Clemens | 324/252 |

FOREIGN PATENT DOCUMENTS

| 33 17 594 A1 | 11/1984 | (DE) . |
| 4232244A1 | 3/1994 | (DE) . |
| 4243357A1 | 6/1994 | (DE) . |
| 4243358A1 | 6/1994 | (DE) . |
| 43 17 512 A1 | 12/1994 | (DE) . |
| 19507303A1 | 9/1996 | (DE) . |
| 195 32 674 C1 | 11/1996 | (DE) . |
| 19520172A1 | 12/1996 | (DE) . |
| 19520178A1 | 12/1996 | (DE) . |
| 19520206A1 | 12/1996 | (DE) . |
| 196 49 265 A1 | 6/1998 | (DE) . |
| 0483373A1 | 5/1992 | (EP) . |
| 0 710 850 A2 | 5/1996 | (EP) . |

OTHER PUBLICATIONS

Published International Application No. 94/17426 (Van den Berg et al), dated Aug. 4, 1994.

* cited by examiner

Primary Examiner—Gerard R. Strecker
(74) Attorney, Agent, or Firm—Herbert L. Lerner; Laurence A. Greenberg; Werner H. Stemer

(57) ABSTRACT

A sensor device for detecting the direction of an external magnetic field using a magnetoresistive sensor element, includes a GMR multilayer system having at least one soft magnetic measurement layer, at least one harder bias layer and at least one nonmagnetic intermediate layer disposed therebetween. The sensor element is to include at least two element parts, the multilayer systems of which are constructed on a common substrate and the magnetization directions of which include an angle which is unequal to 0° or unequal to 180° and the measurement signals of which are to be evaluated in common.

11 Claims, 4 Drawing Sheets

SENSOR DEVICE FOR DETECTING THE DIRECTION OF AN EXTERNAL MAGNETIC FIELD USING A MAGNETORESISTIVE SENSOR ELEMENT

BACKGROUND OF THE INVENTION

Field of the Invention

The invention relates to a sensor device for detecting the direction of an external magnetic field through the use of at least one sensor element, including a multilayer system having a very great magnetoresistive effect (GMR) and having at least one soft magnetic measurement layer, at least one relatively harder bias layer with a predetermined direction of magnetization and at least one nonmagnetic intermediate layer disposed therebetween. A corresponding sensor device can be inferred from International Publication No. WO 94/17426, corresponding to U.S. Pat. No. 5,650,721.

In layers of ferromagnetic transition metals such as Ni, Fe or Co and alloys thereof, there may be a dependence of the electrical resistance on the magnitude and the direction of a magnetic field permeating the material. The effect occurring in such layers is called the "anisotropic magnetoresistance (AMR)" or "anisotropic magnetoresistive effect". In physical terms, it is based on the differing scatter cross sections of electrons with differing spin and the spin polarity of the D band. The electrons are designated as majority or minority electrons. In the case of corresponding magnetoresistive sensors, in general, a thin layer of such a magnetoresistive material having a magnetization in the layer plane is provided. The change in resistance upon rotation of the magnetization with respect to the direction of a current inducted through the sensor may then amount to a few percent of the normal isotropic (=Ohmic) resistance.

Furthermore, magnetoresistive multilayer systems are known which include a plurality of ferromagnetic layers that are disposed in a stack and which are separated from one another in each instance by metallic, nonmagnetic intermediate layers and the magnetizations of which in each instance preferably lie in the layer plane. In that case, the thicknesses of the individual layers are markedly smaller than the mean free path of the conduction electrons. In such multilayer systems, in addition to the mentioned anisotropic magnetoresistive effect AMR, it is now possible for a so-called "giant magnetoresistive effect" or "giant magnetoresistance (GMR)" to occur (see, for example, Published European Patent Application 0 483 373 A1). Such a GMR effect is based on a scattering of majority and minority conduction electrons "of different strengths" at interfaces between the ferromagnetic layers and the intermediate layers adjacent thereto as well as on scattering effects within those layers. In that case, the GMR effect is an isotropic effect. It may be considerably greater than the anisotropic effect AMR. In general, reference is made to a GMR effect (at room temperature), if it adopts values which are markedly above those of AMR single layer elements.

In a first type of corresponding multilayer systems showing a GMR effect, in the absence of an external magnetic field, adjacent magnetic layers are oriented to be magnetically antiparallel by reason of a mutual coupling. That orientation can be converted, by an external magnetic field, into a parallel orientation. In contrast, a second type of GMR multilayer systems has a so-called bias layer, which is magnetically harder than an existing measurement layer which is magnetically as soft as possible. In that case, the measurement layer and/or the bias layer may also be replaced in each instance by a plurality of layers stacked to form a packet. However, in the text which follows only individual layers will be assumed in each instance.

In the case of such a layer system of the second type, the measurement layer and the bias layer are mutually magnetically decoupled by a nonmagnetic intermediate layer. In the absence of an external magnetic field, the magnetizations of the two magnetic layers then have some relationship to one another, for example antiparallel. Under the influence of an external magnetic field $H_m$ (which is the component of the measurement field in the layer plane of the measurement layer), the magnetization $M_m$ of the soft magnetic measurement layer then becomes oriented in a manner corresponding to the direction of the magnetic field, while the orientation of the magnetically harder bias layer remains virtually unchanged. In that case, the angle $\phi$ between the magnetization directions of the two layers determines the resistance of the multilayer system: In the case of a parallel orientation, the resistance is low, and in the case of an antiparallel one, it is high. That follows from the fact that an unambiguous relation exists between the quantities $M_m$ and $H_m$. In that connection, the following applies in the simplest case:

$$M_m \cdot H_m = M_m H_m.$$

(In this case, the vector quantities are identified by bold script and the scalar quantities by non-bold scripts).

The magnetoresistance signal $\Delta R$ of such a GMR multilayer system is then given by:

$$\Delta R = A(1 - \cos \phi).$$

It is evident from this equation that $\Delta R$ adopts the same values for $\phi = \phi_0$ and $\phi = -\phi_0$. However, that means that the angle $\phi$ can be unambiguously determined only within a sector of 180°. In addition, the angle sensitivity $d\Delta R/d\theta = A\sin\theta$ is very low for $\theta = 0$ and $\theta = \pi$, where $\theta$ is the angle between the direction of the external magnetic field $H_m$ and the reference direction stipulated by the magnetization of the bias layer (see the initially mentioned International Publication No. WO 94/17426, corresponding to U.S. Pat. No. 5,650,721).

SUMMARY OF THE INVENTION

It is accordingly an object of the invention to provide a sensor device for detecting the direction of an external magnetic field using a magnetoresistive sensor element, which overcomes the hereinafore-mentioned disadvantages of the heretofore-known devices of this general type, which permits a 360° angle detection and which reduces the problem of an excessively low sensitivity.

With the foregoing and other objects in view there is provided, in accordance with the invention, a sensor device for detecting the direction of an external magnetic field, comprising a substrate; at least one sensor element including at least two element parts; the at least two element parts having magnetization directions enclosing an angle unequal to 0° or unequal to 180°; the at least two element parts having measurement signals to be evaluated in common; the at least two element parts having multilayer systems with a very great magnetoresistive effect; the multilayer systems constructed in common on the substrate; and the multilayer systems each having at least one soft magnetic measurement layer, at least one relatively harder bias layer with a predetermined direction of magnetization, and at least one nonmagnetic intermediate layer disposed between the measurement layer and the bias layer.

In this case, the invention is based on the consideration that with the two preferably identically constructed sensor element parts, two sensor part signals which are to be considered or evaluated in common are to be obtained. The signals create a possibility of an unambiguous distinction between the ranges 0° to 180° and 180° to 360°.

In accordance with another feature of the invention, the sensor element parts are connected, separately from one another, to a common signal evaluating device.

In accordance with a further feature of the invention, the angle enclosed by the magnetization directions of two of the sensor element parts of the at least one sensor element is between 20° and 160° or between 200° and 340°.

In accordance with an added feature of the invention, the angle enclosed by the magnetization directions is at least approximately n·45°±10° where n=1,2,3,5,6 or 7.

In accordance with an additional feature of the invention, the angle included by the magnetization directions is at least approximately 90° or 270°.

In accordance with yet another feature of the invention, the sensor element parts have the same layer structure and the same geometry.

In accordance with yet a further feature of the invention, the measurement layers and/or the bias layers of each of the sensor element parts are formed of a layer packet including a plurality of layers.

In accordance with yet an added feature of the invention, there is provided at least one conductor track associated with each multilayer system of a sensor element part, for conducting a setting current for a fixed setting of a magnetization in the bias layer of the multilayer system.

In accordance with a concomitant feature of the invention, a plurality of the conductor tracks are electrically connected in parallel to form a strip conductor configuration.

Other features which are considered as characteristic for the invention are set forth in the appended claims.

Although the invention is illustrated and described herein as embodied in a sensor device for detecting the direction of an external magnetic field using a magnetoresistive sensor element, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

A sensor device according to the invention includes at least one sensor element which has at least two sensor element parts that are advantageously constructed on a common substrate using thin film technology. The structure of the element parts is known per se (see, for example, Published European Patent Application 0 483 373 A1 or German Published, Non-Prosecuted Patent Applications DE 42 32 244 A1; DE 42 43 357 A1, corresponding to U.S. Pat. No. 5,668,473; or DE 42 43 358 A1, corresponding to U.S. Pat. No. 5,686,838).

Figure 1:
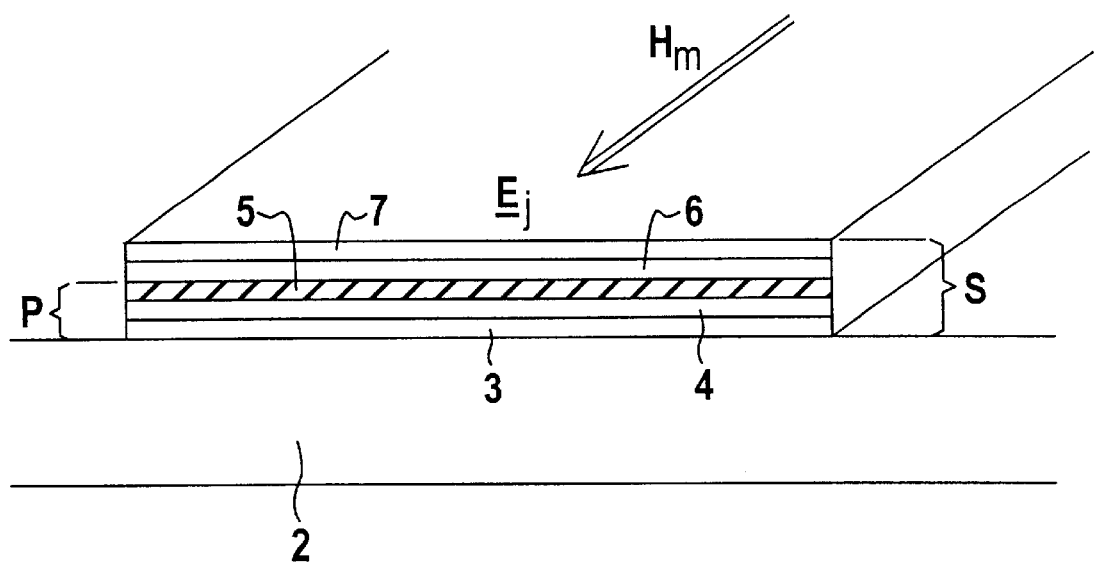
FIG. 1 is a fragmentary, diagrammatic, cross-sectional view of an individual sensor element part of a sensor device according to the invention.

Referring now in detail to the figures of the drawings, in which mutually corresponding parts are provided with the same reference symbols, and first, particularly, to FIG. 1 thereof, it is seen that each element part $E_j$ includes a multilayer system S which is applied to a substrate 2 and which is typical of a GMR element. Advantageously, this multilayer system has a hard magnetic layer 3 as the lowermost layer, an intermediate layer 4 which is applied thereto and which acts as a coupling layer, as well as a ferromagnetic or ferrimagnetic layer 5 which is deposited upon the intermediate layer 4. In this case, this layer 5 represents a bias layer with a direction of magnetization, in its layer plane, which is at least approximately constant within the measurement range. The layers 3 to 5 which are, in particular, antiferromagnetically coupled, form a so-called bias layer packet P. In place of this packet, it is also possible to provide a magnetically relatively hard subsystem of a ferromagnetic layer and a directly abutting antiferromagnetic layer, or only an individual bias layer. According to the illustrative embodiment, the layer packet is magnetically at least approximately decoupled, through a nonmagnetic intermediate layer 6, from a measurement layer 7 which is sensitive to a magnetic field and is magnetically as soft as possible. Non-illustrated terminal contacts for conducting a planned current through the element part are fitted to the measurement layer. This structure of the layer system S may furthermore be covered by a protective layer. An (external) magnetic measurement field $H_m$ which is to be detected at least with respect to its direction, is indicated by an arrow.

The resistance of such a GMR sensor element part $E_j$ is then dependent upon the relative orientation of the magnetization of the measurement layer 7 in relation to that of the bias layer packet P. The alteration of this resistance may be utilized for the purpose of determining the direction of an applied magnetic field and thus, for example, rotational positions or absolute positions (also see International Publication No. WO 94/17426, corresponding to U.S. Pat. No. 5,650,721). This alteration in resistance specifies a quantity $\Delta R_r$ of the magnetoresistive effect. In this case, the quantity $\Delta R_r$ is defined in the following way:

$$\Delta R_r = [R(\uparrow\downarrow) - R(\uparrow\uparrow)]/R(\uparrow\uparrow).$$

Due to the field-direction sensitivity of the GMR sensor elements, the magnetoresistive effect $\Delta R_r$ represents the difference of the resistance between the antiparallel and the parallel magnetization orientation of the measurement layer with respect to the bias layer or a corresponding bias layer packet. In the equation which has been set out hereinabove, the mutual orientation of the magnetization of the measurement layer and of the bias layer is illustrated by the orientation of the arrows. In general, a magnetoresistive effect is designated as a GMR effect if the quantity $\Delta R_r$ amounts to at least 2% (at room temperature).

Advantageously, the layer-type structure of the sensor element part $E_j$ having a large magnetoresistive effect can also be constructed as a so-called multilayer system. Such a system is distinguished in that, besides the above explained layer system, it also includes further layers or layer packets and, if appropriate, has a sequence of periodically recurring layers (for example, see German Published, Non-Prosecuted Patent Application DE 42 43 358 A1, corresponding to U.S. Pat. No. 5,686,838).

Figure 2:
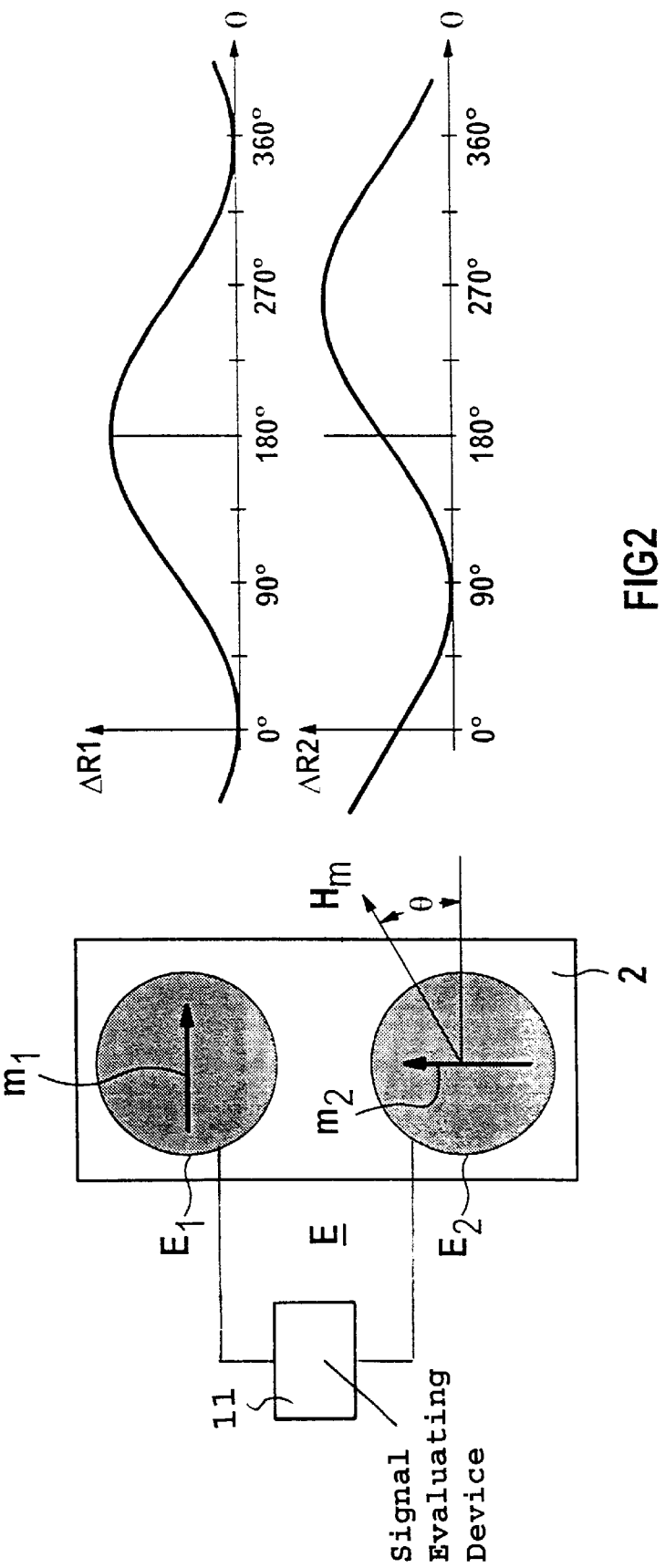
FIG. 2 is an elevational view of two sensor element parts with complementary measurement ranges and their associated measurement signal curves.

Two sensor element parts $E_1$ and $E_2$ having a circular cross section in each instance are indicated in FIG. 2. Together, the sensor element parts form a sensor element E of a sensor device according to the invention. In this case, such a sensor device may have a plurality of such elements, which may, for example, be connected to form a bridge. The magnetizations of the bias layers of each element part are directed in a standard manner in the plane of the common substrate 2 and are designated by reference symbols $m_1$ and $m_2$, respectively. In the case of each sensor element part, these directions of magnetization stipulate a reference direction, with respect to which an orientation angle θ of a component of a directed external magnetic field $H_m$ which lies in the plane of the measurement layer is measured. As is evident from the figure, these reference lines or the corresponding bias layer magnetization directions of each element part $E_1$ and $E_2$ belonging to a sensor element are to include between them an angle α which, according to the invention, is unequal to (≠) 0° or unequal to (≠) 180°. In general, the following should at least approximately be applicable for this angle: α=(n·45°) where n=1,2,3,5,6,7. The intention is to also include a deviation by ±10°. An angle α of at least approximately 90°, which is taken as the basis for the illustrative embodiment of FIG. 2, is to be regarded as particularly advantageous. In this case, respective resistance changes ΔR1 and ΔR2 which are dependent upon the orientation angle θ are obtained, which are evident from the associated diagrams. As may be immediately discerned upon a joint consideration of these diagrams, it is advantageously possible to determine the angle θ without losses of resolution, unambiguously within the complete angular range between 0 and 360°. A measurement signal evaluating device 11 which is shown in FIG. 2 serves this purpose. This evaluating device is individually connected to each one of the sensor element parts $E_1$ and $E_2$.

Figure 3:
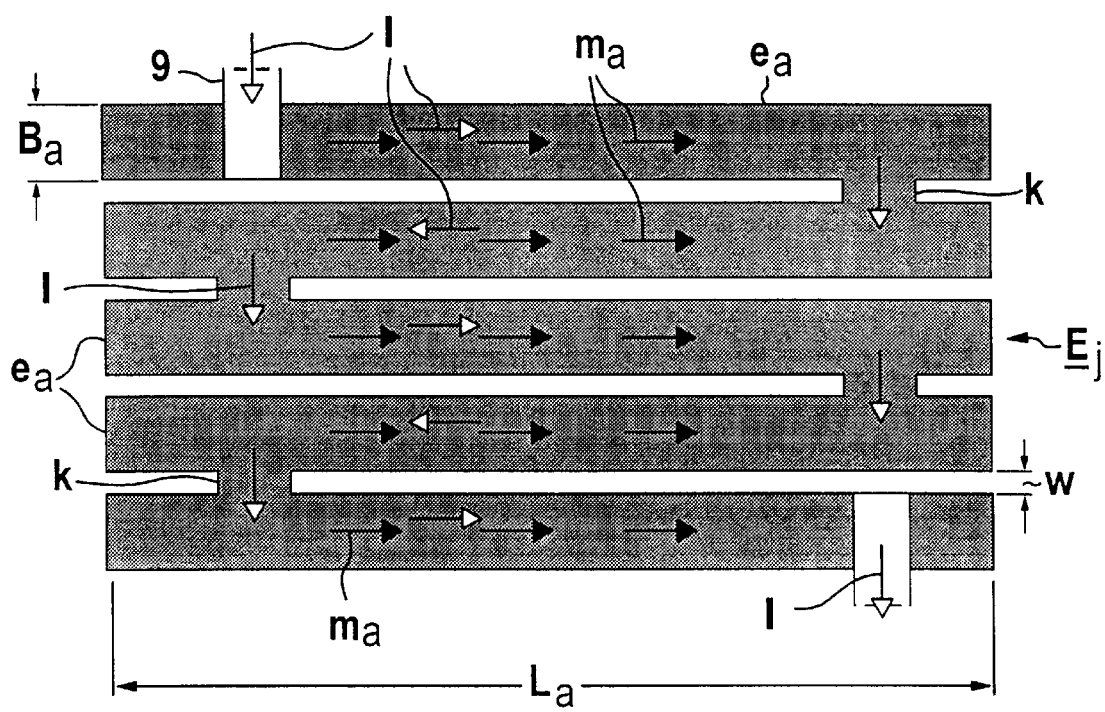
FIG. 3 is an elevational view of a particular embodiment of a sensor element part.

FIG. 3 shows an embodiment that is known per se from German Published, Non-Prosecuted Patent Application DE 195 07 303 A1, for a sensor element part $E_j$ of a sensor element of a sensor device according to the invention. This element part is composed of a plurality of strip shaped partial pieces $e_a$ which are elongated in the direction of conduction of a current I. These five partial pieces according to FIG. 3 in each instance have a predetermined length $L_a$ and a predetermined width $B_a$ and are disposed parallel and side by side with the formation of a mutual intermediate space having a width w. They are connected in series in a meander manner, as seen in the current conduction direction, through the use of contact bridges k. These contact bridges are constructed in such a way that both the partial pieces $e_a$ as well as the contact bridges are formed by appropriate structuring, for example through the use of electron lithography, from a common laminar layer structure. Furthermore, in the figure nonmagnetic current connection paths of the sensor element part $E_j$ are designated by reference numeral 9, and the magnetization and reference directions of the bias layers of the individual partial pieces by reference symbol $m_a$.

The advantages of the embodiment indicated in FIG. 3 are to be seen firstly in that a desired impedance level of a few kΩ can be achieved. Secondly, an isotropic magnetization behavior may be set in the measurement layers through the use of a predetermined geometry and through the use of a marked preferential direction. A further advantage of the geometry shown is that the strip shape is able to contribute to a stabilization of the magnetization in the bias layers.

In the sensor elements of a sensor device according to the invention, magnetizations with differing orientation must be impressed in the bias layers or bias layer packets of the individual sensor element parts in a narrow space. Advantageously, for this purpose it is possible to provide magnetization directions in the form in which they are evident from German Published, Non-Prosecuted Patent Applications DE 195 20 172 A1, DE 195 20 178 A1 or DE 195 20 206 A1. With such magnetization devices, in order to set the magnetizations, use is made of magnetic fields of currents passing through strip conductors which extend above the individual sensor element parts and are associated therewith. In this case, the strip conductors may be fitted directly and in an insulated manner on the respective multilayer system and be connected to the latter or, alternatively, they may be positioned separately from this multilayer system, above the latter.

Figure 4:
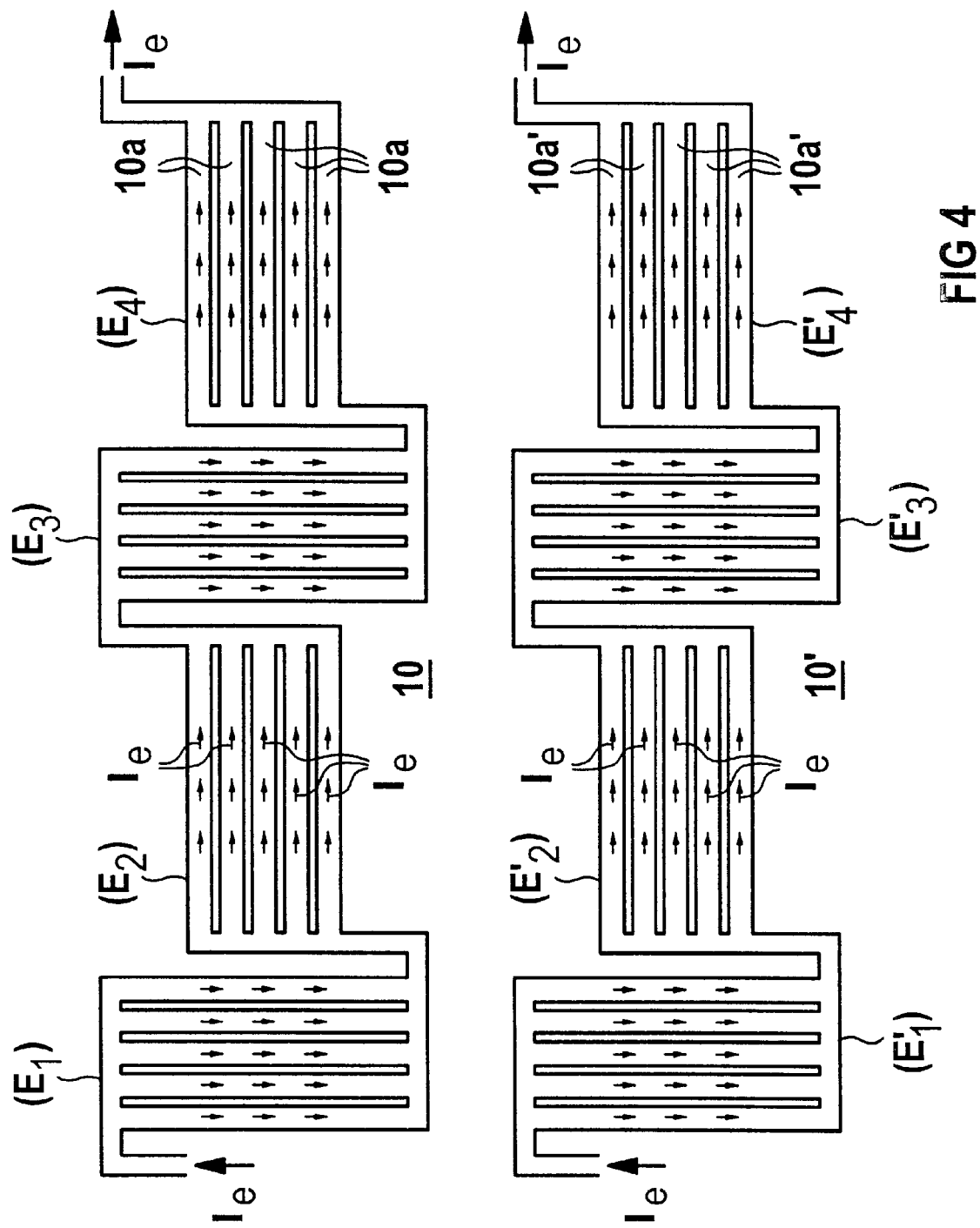
FIG. 4 is an elevational view illustrating a conductor geometry for the magnetization of sensor element parts according to FIG. 3.

A possible embodiment of corresponding strip conductors is shown in FIG. 4. In this case, it has been assumed that two identical sensor elements E and E' extending parallel to one another each have four reference series-connected sensor element parts $E_1$ to $E_4$ and $E'_1$ to $E'_4$. In this case, each sensor element part is constructed in correspondence with the embodiment according to FIG. 3. In each case two series-connected sensor element parts have mutually perpendicular magnetization directions according to FIG. 2. In the figure, it is only possible to see respective strip conductor configurations 10 and 10', which cover the respective multilayer systems of the individual sensor element parts $E_1$ to $E_4$ and $E'_1$ to $E'_4$ of the sensor elements. In this case, the strip conductor configurations 10 and 10' respectively have respective strip conductors 10a and 10a' in the region of the individual sensor element parts, which extend in each instance above an associated partial piece ($e_a$) of a sensor element part. The strip conductors 10a and 10a' are connected in parallel in the region of the sensor element parts. The setting current to be conducted by the strip conductor configurations, for generating the respective magnetic setting fields, is designated by reference symbol $I_e$.

Such a parallel connection of individual strip conductors which is obtained, for example, by slotting a relatively large surface, can advantageously also be provided for other, relatively large-area sensor element parts or sensor elements. In this way, it is indeed possible to guarantee that in the case of a bent-over direction of current conduction (see FIG. 4), the current is forced into the direction of the individual strip conductors and not in a direction extending obliquely thereto. The direction of magnetization is then to be stipulated precisely in a corresponding manner.

I claim:

1. A sensor device for detecting a direction of an external magnetic field, comprising:

a sensor element including at least two element parts;

said at least two element parts having multilayer systems with a very great magnetoresistive effect;

said multilayer systems each having at least one soft magnetic measurement layer, at least one relatively harder bias layer with a predetermined direction of magnetization, said relative harder bias layers of said at least two element parts having magnetization directions enclosing an angle unequal to 0° and unequal to 180°; and a signal evaluating device connected individually to said at least two element parts.

2. The sensor device according to claim 1, including a common substrate, said multilayer systems being deposited on said common substrate.

3. The sensor device according to claim 1, wherein said angle enclosed by said magnetization directions of two of said sensor element parts of said at least one sensor element is between 20° and 160°.

4. The sensor device according to claim 1, wherein said angle enclosed by said magnetization directions of two of said sensor element parts of said at least one sensor element is between 200° and 340°.

5. The sensor device according to claim 1, wherein said angle enclosed by said magnetization directions is at least approximately n·45°±10° where n=1,2,3,5,6 or 7.

6. The sensor device according to claim 1, wherein said angle included by said magnetization directions is at least approximately 90°.

7. The sensor device according to claim 1, wherein said angle included by said magnetization directions is at least approximately 270°.

8. The sensor device according to claim 1, wherein said sensor element parts have the same layer structure and the same geometry.

9. The sensor device according to claim 1, wherein at least one of said measurement layer and said bias layer of each of said sensor element parts are formed of a layer packet including a plurality of layers.

10. The sensor device according to claim 1, including at least one conductor track associated with each multilayer system of a sensor element part, for conducting a setting current for a fixed setting of a magnetization in said bias layer of said multilayer system.

11. The sensor device according to claim 10, wherein a plurality of said conductor tracks are electrically connected in parallel to form a strip conductor configuration.

* * * * *